United States Patent [19]

Müller et al.

[11] 4,356,628
[45] Nov. 2, 1982

[54] METHOD TO RENDER ACCESSIBLE AN ELECTRICAL CONTACT REGION OF A COMPOSITE ELEMENT

[75] Inventors: Klaus Müller, Tamm; Karl-Hermann Friese, Leonberg; Gerhard Holfelder, Ditzingen, all of Fed. Rep. of Germany

[73] Assignee: Robert Bosch GmbH, Stuttgart, Fed. Rep. of Germany

[21] Appl. No.: 193,187

[22] Filed: Oct. 1, 1980

[30] Foreign Application Priority Data

Oct. 5, 1979 [DE] Fed. Rep. of Germany ....... 2940394

[51] Int. Cl.³ .......................................... H01R 43/00
[52] U.S. Cl. .................................................... 29/878
[58] Field of Search .............. 29/854, 860, 874, 876, 29/877, 878, 883, 884; 156/89, 196, 199; 264/60, 61; 338/28, 34, 325, 329, 330; 428/913

[56] References Cited

U.S. PATENT DOCUMENTS 3,248,779 5/1966 Yuska et al. ........................... 29/854
4,007,435 2/1977 Tien ..................................... 338/34

FOREIGN PATENT DOCUMENTS 2508224 9/1975 Fed. Rep. of Germany ........ 156/89

Primary Examiner—Ervin M. Combs
Attorney, Agent, or Firm—Frishauf, Holtz, Goodman & Woodward

[57] ABSTRACT

To permit easy attachment, for example, by soldering, of a connecting lead wire to a conductive track on a ceramic plate connected closely adjacent to another plate which may also be ceramic, the first ceramic plate, at least, is bent away from the other ceramic plate at the connecting portion during manufacture; the manufacturing process includes heating the plate to be bent away to be in plastic condition and then applying a bending force to form the bend, permitting the so bent plate to cool, and joining the so-bent plate to the other plate with which it is to form a composite, for example, by glass melt. The bending force may be gravity, by permitting the unsintered plate, upon heating, to fall on a curved surface; or the bending force can be generated by applying a layer of a material having differential shrinkage to the flat, unsintered plate, and heating the composite, so that, upon differential shrinkage, the ceramic plate will be bent away from its originally plane, flat state.

9 Claims, 6 Drawing Figures

METHOD TO RENDER ACCESSIBLE AN ELECTRICAL CONTACT REGION OF A COMPOSITE ELEMENT

The present invention relates to a method to render mechanically accessible the contact region of a composite element and more particularly the contact region of a composite element including a ceramic, or ceramic-coated plate, facing another ceramic, or ceramic-coated plate, in which electrical terminal connections are to be made to conductive tracks placed on the ceramic surfaces at the surface portions facing each other, and more particularly to render accessible conductive tracks applied to ceramic plate-like elements used in sensors to determine the oxygen content of gases, especially combustion gases, for example, combustion exhaust gases from internal combustion engines. A sensor of the type to which the invention relates is shown, for example, in U.S. Pat. No. 4,007,435, Tien.

BACKGROUND AND PRIOR ART

Ceramic plates, or ceramic plates applied to a carrier substrate, for example metal, are used as carriers or sensing electrolyte structures in various gas sensors, and, also, as carriers for layer-formed heaters which are applied adjacent an ion conductive solid electrolyte material, for example, zirconium dioxide, to which sensing electrodes are applied. Such sensors—see for example, the aforementioned U.S. Pat. No. 4,007,435—are used in combination with electrical power supply circuits and electrical evaluation circuits, the power supply circuits providing heating power to the heating conductor path or paths of the sensor, and the evaluation circuits being connected to the sensor to determine the characteristics of the gases as a function of output signals derived therefrom. It is difficult to make connections of leads, or wire or cable connections to the contact regions of conductive paths applied to the plate-like sensing elements. It is customary to make the connections in form of solder joints to connect electrical lead wires to conductive tracks on the ceramic elements, the conductive tracks leading to the measuring electrode portions and the heating portions, respectively, of the sensor. The difficulty is the structural arrangement of the sensor elements which are composite elements. The elements are small, and the available space to make contact connections in the connecting region of the sensors is so minute that difficulties in connection results. A typical element may have ceramic material in the connecting end portion of 1 mm thickness and 6 mm width, for example. Applying more than one connecting wire to a composite element on which two or more such ceramic plates are placed facing each other, immediately adjacent each other or only closely spaced from each other, causes great difficulty.

THE INVENTION

It is an object to provide a method to form readily accessible contact regions for a composite element so that connection of electrical wires to conductive tracks on ceramic plates, or ceramic coatings can be readily effected.

Briefly, the ceramic is bent away, backwardly,—with respect to the surface on which the conductive track or connecting portion is located—during sintering of the ceramic to which the conductive track is applied; the other element, to which the ceramic is to be connected is joined thereto in a separate manufacturing step.

The bending-away, in accordance with the invention, is carried out during the sintering of the ceramic, and while the ceramic is in plastic condition. The bending force can either be gravity—for example, by sintering the ceramic body in such a way that the portion which is to be bent is, before sintering, unsupported, extending freely over a mold form on which it can come to lie as it bends under its own weight while in plastic condition due to heating; or, in accordance with another embodiment of the invention, the bending force can be applied by differential shrinkage forces, that is, by applying a material to the concave, or convex side of the bend, respectively, which has either lesser, or greater shinkage, upon sintering and subsequent cooling, than the base ceramic, so that the bend-away effect will be realized.

The method in accordance with the invention has the advantage that the contact regions on the structural components will be bent back from the major plane of the plate-like body, so that facing elements become accessible, by being spread apart in the contact region. This permits use of ceramic plates, or supported ceramic structures, which are all of equal length and which, in a facing direction, are of equal plan outline, so that the width of the entire plate can be utilized to effect connections. The methods have the advantage of being simple and inexpensive and can readily be carried out under mass production conditions by current technology, so that no additional, or expensive manufacturing apparatus is required.

DRAWINGS

Figures 1, 2, 3:
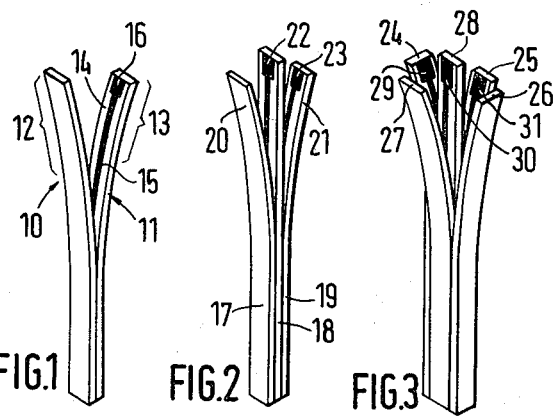
FIG. 1 is a perspective view of a two-component composite ceramic structural element, in which the contact region is made in accordance with the method of the present invention.
FIG. 2 is a view similar to FIG. 1 showing a three-element composite structure
FIG. 3 is a view similar to FIG. 1 showing a five-element composite structure.

Two plate-like ceramic elements 10,11 (FIG. 1) of generally elongated shape are connected together by a glass melt (not shown in FIGS. 1-3). The portion of the plates below the legend "FIG. 1" has been omitted, and extends to a sensing region. The sensor may have any suitable structure and operating mode. As seen in FIG. 1, the upwardly directed end portions 12, 13 of the plates 10,11 form the connecting portions. They are spread apart from each other to provide for accessibility to a terminal end portion 16 of a connecting track 15 applied to a surface 14 on the plate 11. A similar track may be applied to the plate 10, laterally offset from the track 15, for example, or insulated therefrom by a thin insulating layer, for example, of aluminum oxide.

The elements 10,11 may consist of aluminum oxide, and a typical dimension is a thickness of 1 mm, a width of 6 mm, and a length of about 8 cm. The ceramic elements 10,11 may carry, at their lower longitudinal portions, sensing structures for gases and their temperatures. They are usually supplied with layer-shaped heating elements. For a discussion of such sensors, reference is made to the referenced U.S. Pat. No. 4,007,435, Tien. The electrical connections to the sensors and the heater elements are formed as conductive tracks and extend to the connecting regions 12,13 as seen in FIG. 1. For example, conductive track 15 on the major surface 14 of sensor 11 is clearly seen, the track 15 terminating in a contacting or connecting region 16, located at the end portion 13 of element 11. The conductive track 15 and the contacting region 16 consist essentially of platinum, or a platinum-type metal applied preferably by thin film technology, for example, by printing, vapor deposition, or the like on the ceramic 11. In accordance with the invention, the end portions 12,13 are spread apart from the major planes of the remainder of the elements 10,11. Thus, the connecting portion 16 is easily accessible for connection by solder to a connecting wire 43—see FIG. 6—for example.

In the embodiment of FIG. 1, both end portions 12,13 of the elements 10,11 are spread apart. Depending on size and degree of bend, and space availability, it is equally possible to spread only one of the end portions 12 or 13 of one of the plates 10 or 11 from the other, the other plate being left flat and plane.

FIG. 2 illustrates a sensor arrangement having three ceramic plates 17,18,19 joined together. The three plates 17,18 and 19, each of which may have the same dimension in plan view, and for example of the same dimension as elements 10,11 of FIG. 1, are joined at their lower portion. The center element 18 consists of stabilized zirconium dioxide. Elements 17, 19 consists of aluminum oxide. The straight center element 18 is retained in flat plan form; the end portions 20,21 of the outer plates 17,19 are bent outwardly, or spread apart, and thus provide for accessibility of the contact regions in the end portions of the respective plates, of which regions 22,23 and the distance of these regions from the adjacent plates are clearly seen.

The method can be used for various types of sensors, having various types of arrangements. FIG. 3 illustrates a composite sensor structure having five plate-like elements 24, 25,26,27,28. The composite of elements 25,27,28 can be similar to that of FIG. 2; elements 24,26 are additionally applied on the narrow sides of elements 25,27,28.

The various individual plate elements can be joined together either by sintering, or by a glass melt, or by both.

As best seen in FIG. 3, the respective outer elements are bent away from the major planes thereof, and thus the respective terminal end portions, of which terminals 29,30,31 only are visible are easily accessible for connection to cable or lead wires.

The method—discussed below—is applicable not only to composite structures utilizing only ceramic elements; metallic plates and/or metallic plates with a ceramic coating can be incorporated in the composite element.

The ceramic elements 10,11,17,18,19,24,25,26,27 and 28 are, together with their conductive tracks—see, for example, track 15 of FIG. 1—and together with the respective measuring or sensing elements, sintered together at a suitable sintering temperature. Thereafter, and at a suitable temperature, for example again by sintering, or by joining by means of a glass melt, the various elements are connected together to form the composite sensor structure. The elements may, also, be joined together by a mechanical holder or by a wrapping material, or by holding structures within the housing (not shown).

In accordance with a feature of the invention, the terminal end portions 12,13 of the respective elements 10,11,17,18 . . . which may already have the conductive track 15 and contacting region 16 applied thereto, and/or associated and measuring heating elements, are bent so that they will be spread apart during the sintering step. This can be carried out simply and inexpensively, by technology suitable for mass production.

THE PROCESS

The process will be described in connection with the bending of the ceramic element 11. The ceramic element 11, with connecting track 15 and contact region 16 applied thereto, and further connected—not shown—to a suitable measuring or sensing element while not yet sintered is applied to a support carrier 29 which has a major surface 30 which is bent away from the major plane of the surface 30 at the portion 33. The initial position of the un-sintered element 11 is shown in broken line, where the end portion 13′ is shown to extend beyond the flat region 31 of the surface 30. To insure proper positioning, a hold-down element 32 is applied to the top surface of element 11, so that element 11 will be securely retained in position during the sintering step.

Figure 4:
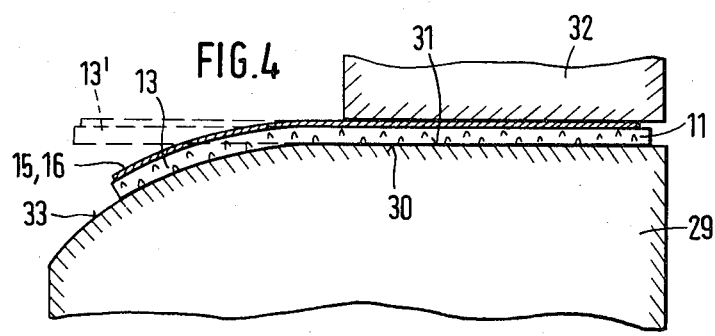
FIG. 4 is a highly schematic longitudinal part sectional view through an apparatus capable of carrying out the method to obtain, for example, the structure of one of the components of FIGS. 1-3, and utilizing gravity as the bending or deflecting force.

Element 11 is then sintered—at a temperature and under conditions well known and as suitable for the element 11. During the heating period in the sintering step, the ceramic element 11 will become plastic, and upon application of the bending force will bend downwardly. The bending force applied in FIG. 4 is the force of gravity, the arrangement being placed with respect to a substrate as illustrated in FIG. 4. Thus, and as the element 11 is heated, the projecting portion 13′ will bend downwardly to form the portion 13. The degree of bending can be readily controlled by suitable shaping of the substrate or support carrier surface 33 of the carrier 29.

The element can be made in a different way, by applying a different force. Rather than using the force of gravity, the force utilized can be the force applied by differential shrinkage of different materials which are adhered to each other.

Figure 5:
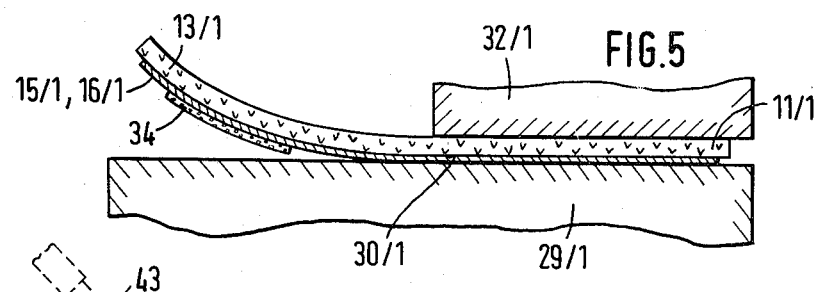
FIG. 5 illustrates apparatus carrying out the method, in part longitudinal section, and to a greatly enlarged scale in which differential shrinkage is used as the bending force; and, FIG. 6 illustrates, again to a greatly enlarged scale, a reinforced ceramic element, utilizing differential shrinkage as the bending force, and applied connecting leads.

Referring to FIG. 5, the ceramic element 11/1 has a conductive track 15/1 and a terminal portion 16/1 applied thereto. The respective measuring and heating elements to which the conductive track 15/1 is connected has been omitted from the drawing. The element 11/1 is applied on a carrier 29/1, with the conductive track 15/1 facing the carrier. It is held in position by a hold-down element 32/1 in a flat plane, longitudinally determined location. The element 11/1, at the initiation of the bending step, is not yet sintered. A cover coating 34 is applied to the end portion 13/1—covering it in part—on the still unsintered flat ceramic element on the surface 30/1 thereof which is opposite to the direction of intended bend. The coating 34 may have a thickness of about 20 $\mu$m, for example, and applied by rolling-on, screen printing, or the like. The material of the coating 34 is so selected that it has a lower shrinkage, upon heating, than the material of the body 11/1. In one example, the body 11/1 may consist of zirconium dioxide having a shrinkage of about 25%. The coating 34 can consist of aluminum oxide having a shrinkage of 21%. The end portion 13/1 of element 11/1, during sintering, then will bend upwardly due to the greater shrinkage of the material of the ceramic element 11/1—see FIG. 5. Rather than using aluminum oxide with 21% shrinkage, the layer 34 could also use other suitable materials, even zirconium dioxide. Zirconium dioxide is available with various shrinkage ratios. Shrinkage of zirconium dioxide can be controlled by additives, for example, calcium, yttrium, ytterbium, and the like, or by mixture of various similar materials having differential shrinkage; differential shrinkage can also be obtained by different compaction of the element 11/1 and a similar cover layer upon manufacture of the element 11/1 and/or the material of the cover layer, that is, for example, during extrusion or press-forming the shape of plate-like body 11/1.

Figure 6:
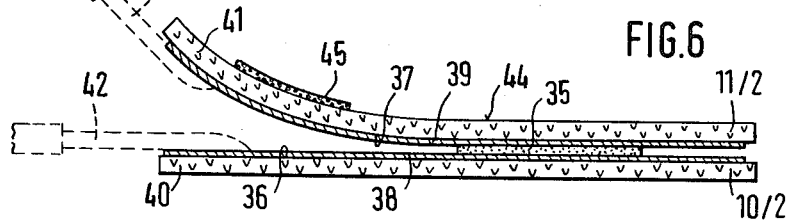

FIG. 6 illustrates two joined ceramic elements 10/1 and 11/1, joined together by a connecting glass 35. The elements 10/2 and 11/2, at their facing major surfaces 36, 37 having conductive tracks 38, 39 applied thereto which lead to sensing or measuring electrodes, heat elements and the like at the side at the right of FIG. 6, and removed therefrom (not shown) in accordance with design requirements of the respective sensor. The end portions 40, 41 of the elements 10/2, 11/2 have conductor connection portions—not separately identified—applied thereto, integral with the respective conductive tracks 38, 39. The end conductive portions, which may be similar to portion 16 (FIG. 1) joined to track 15 are connected to suitable connecting cables 42, 43 by solder joints.

The element 10/2 is flat and plan; the element 11/2 is bent upwardly at its end portion 41, to spread it apart and away from the element 10/2.

The spreading-away of the end portion 41 is obtained by applying a coating 45 of a sinterable material to the surface 44, that is, to the surface in the direction of bending, of element 11/2. In this case, the coating 45 must have a higher shrinkage than the material of element 11/2. The coating 45, again, may have a thickness of about 20 μm, and be applied over a portion of the end portion 41 of element 11/2, for example, approximately as shown in FIG. 6.

The material for coating 45 may be similar to those previously described in connection with FIG. 5. Suitable shrinkage relationships between coating 45 and element 11/2 can be obtained, for example, by suitable choice of additives, in accordance with well known ceramic technology, so that the respective shrinkage relationships can be readily controlled.

The element 18, or 10/2 with the track 38 need not be a ceramic element; it could be a metallic support structure forming a holder or support for the element 11/2, which, essentially, retains its flat plan position, and forms, simultaneously, a support and an electrical connector to the suitable electrical element positioned at the portion thereof removed from that shown in FIG. 6, as required. The conductive track 36 can be insulated by a thin coating of insulating material, for example, aluminum oxide, or by extension of the glaze 35.

Various changes and modifications may be made, and features described in connection with any one of the embodiments may be used with any one of the others, within the scope of the inventive concept.

We claim:

1. Method of forming a readily accessible contact region on a composite plate-like element having
a first plate-like body (11, 11/2, 19, 24, 25) defining a major plane and having a terminal connecting portion (13, 13/1, 21, 41);
an additional plate-like body (10, 17, 26, 27) positioned in contact with, or closely adjacent to said first plate-like body,
at least one of said bodies (11, 11/2, 19, 24, 25) being of ceramic material
including the step of
sintering said at least one body, and
wherein, in accordance with the invention, the sintering step includes the step of
applying a bending force to the terminal connecting portion (13, 13/1, 21, 41) of said at least one ceramic body (11, 11/2, 19, 24, 25) while said body, during sintering, is in plastically deformable condition, in a direction to bend said body, and the contact region (16, 16/1, 23, 29, 31) thereon away from its major plane such that the contact region of said terminal connecting portion of said body is located relative to the center of the bend on the remote surface of the bent body;
and uniting said bodies in a separate connecting step to form said composite element, with the terminal connecting portion of said at least one body, upon cooling, being spread apart from the other body, or bodies, and retaining said spreadapart position.

2. Method according to claim 1 wherein said bending force is formed by the weight of the terminal connecting portion.

3. Method according to claim 1 wherein said bending force is formed by the effect of material shrinkage of different materials.

4. Method according to claim 1 wherein said bending force,
is formed by the weight of the terminal connecting portion
and wherein said sintering step includes providing a support carrier (29) having a convex surface portion (33);
positioning the unsintered at least one ceramic body while being in flat, plan form on the support carrier (29) in position such that the terminal connection portion (13) of said body (11) extends freely over the convex portion (33) of the carrier and being spaced therefrom;
securing said body (11) in position, and heating said body whereby the projecting terminal connecting portion will bend downwardly under its weight to come to lie above said convex portion (33) of the support or substrate (29); and permitting said body to cool.

5. Method according to claim 1 wherein said force is is formed by the effect of material shrinkage of different materials;
and wherein said step of applying the bending force comprises applying a sinterable coating to the terminal region (13/1, 41) of said at least one ceramic body which coating is of a material having the characteristics of differential material shrinkage from said at least one body.

6. Method according to claim 5 wherein the coating (34) comprises a material having a lesser degree of shrinkage than the material of the said at least one ceramic body (11/1) and said coating is applied to the surface (30/1) of said body (11/1) which will become convex when bent away from its major plane; and heating said body and said coating.

7. Method according to claim 5 wherein the coating (45) comprises a material having a higher degree of shrinkage than the material of said at least one ceramic body (11/2) and said coating is applied at the surface of said body which will become concave when bent away from its major plane; and heating said body and said coating.

8. Method according to claim 6 or 7 wherein said coating (34,45) has a thickness which is small with respect to the thickness of said at least one ceramic body.

9. Method according to claim 6 or 7 wherein said at least one ceramic body (11/1, 11/2) has a thickness of about 1 mm; and said coating (34, 45) has a thickness of about 2 mm;

and wherein said body comprises a body material, and said coating comprises a coating material;

and wherein the degree of shrinkage of said materials is approximately in the order of 20% and 25%, respectively.

* * * * *